United States Patent
Li et al.

(10) Patent No.: US 9,935,094 B2
(45) Date of Patent: Apr. 3, 2018

(54) GOA CIRCUIT BASED ON LTPS SEMICONDUCTOR THIN FILM TRANSISTOR

(71) Applicant: Wuhan China Star Optoelectronics Technology Co., Ltd., Wuhan (CN)

(72) Inventors: Yafeng Li, Wuhan (CN); Jinfang Wu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 254 days.

(21) Appl. No.: 14/912,599

(22) PCT Filed: Jan. 29, 2016

(86) PCT No.: PCT/CN2016/072648
§ 371 (c)(1),
(2) Date: Feb. 17, 2016

(87) PCT Pub. No.: WO2017/096704
PCT Pub. Date: Jun. 15, 2017

(65) Prior Publication Data
US 2018/0040600 A1 Feb. 8, 2018

(30) Foreign Application Priority Data
Dec. 7, 2015 (CN) .......................... 2015 1 0899951

(51) Int. Cl.
*G09G 3/36* (2006.01)
*G11C 19/28* (2006.01)
(Continued)

(52) U.S. Cl.
CPC ...... *H01L 27/0207* (2013.01); *G02F 1/13454* (2013.01); *G02F 1/136213* (2013.01);
(Continued)

(58) Field of Classification Search
CPC ......... G09G 3/3677; G09G 2310/0286; G09G 2310/0283; G09G 2300/0408;
(Continued)

(56) References Cited

U.S. PATENT DOCUMENTS

| | | | |
|---|---|---|---|
| 9,190,170 B1* | 11/2015 | Hao | G09G 3/3677 |
| 2011/0221736 A1* | 9/2011 | Pak | G09G 3/3677 345/211 |
| 2016/0071614 A1* | 3/2016 | Lee | G09G 5/006 345/214 |

\* cited by examiner

*Primary Examiner* — Hong Zhou
(74) *Attorney, Agent, or Firm* — Leong C. Lei (57) ABSTRACT

The present invention provides a GOA circuit based on LTPS semiconductor thin film transistor to control the voltage levels of the first node (Q(n)) and the second node (P(n)) with the forward scan direct current control signal (U2D) and the backward scan direct current control signal (D2U). The clock signal (CK(M)) is merely in charge of the output of the GOA unit of corresponding stage, which can effectively reduce the loading of the clock signal. It ensures that the entire loading of the clock signal after the GOA units of multiple stages are coupled to promote the output stability of the GOA circuit, and to realize the forward-backward scan of the GOA circuit. Moreover, the GOA unit of each stage comprises only ten thin film transistors, which is beneficial to reduce the layout space of the GOA circuit and to achieve the narrow frame design of the display device.

13 Claims, 9 Drawing Sheets

(51) Int. Cl.
    *H01L 27/02*     (2006.01)
    *H01L 29/417*    (2006.01)
    *G02F 1/1362*    (2006.01)
    *H01L 27/12*     (2006.01)
    *G02F 1/1345*    (2006.01)

(52) U.S. Cl.
    CPC ......... *G09G 3/3648* (2013.01); *G09G 3/3674* (2013.01); *H01L 27/1214* (2013.01); *H01L 29/41733* (2013.01)

(58) Field of Classification Search
    CPC ......... G09G 3/3266; G09G 2310/0289; G09G 2310/0281; G09G 3/3648; G09G 3/3674; G09G 2310/0267; G09G 2300/0871; G09G 2310/0202; G09G 2310/0213; G09G 2310/062; G11C 19/28; G02F 1/13454; G02F 1/136213; H01L 27/1214; H01L 27/0207; H01L 29/41733
    See application file for complete search history.

GOA CIRCUIT BASED ON LTPS SEMICONDUCTOR THIN FILM TRANSISTOR

FIELD OF THE INVENTION

The present invention relates to a display technology field, and more particularly to a GOA circuit based on LTPS semiconductor thin film transistor.

BACKGROUND OF THE INVENTION

The Liquid Crystal Display (LCD) possesses advantages of thin body, power saving and no radiation to be widely used in many application scope, such as LCD TV, mobile phone, personal digital assistant (PDA), digital camera, notebook, laptop, and dominates the flat panel display field.

The GOA technology, i.e. the Gate Driver on Array technology utilizes the original array manufacture processes of the liquid crystal display panel to manufacture the driving circuit of the level scan lines on the substrate around the active area, to replace the external Integrated Circuit (IC) for accomplishing the driving of the level scan lines. The GOA technology can reduce the bonding procedure of the external IC and has potential to raise the productivity and lower the production cost. Meanwhile, it can make the liquid crystal display panel more suitable to the narrow frame or non frame design of display products.

With the development of the LTPS semiconductor TFT, the LTPS-TFT LCD also becomes the focus that people pay lots of attentions. Because the LTPS semiconductor has better order than amorphous silicon (a-Si) and the LTPS itself has extremely high carrier mobility which can be more than 100 times of the amorphous silicon semiconductor, which the GOA skill can be utilized to manufacture the gate driver on the TFT array substrate to achieve the objective of system integration and saving the space and the cost of the driving IC.

Figure 1:
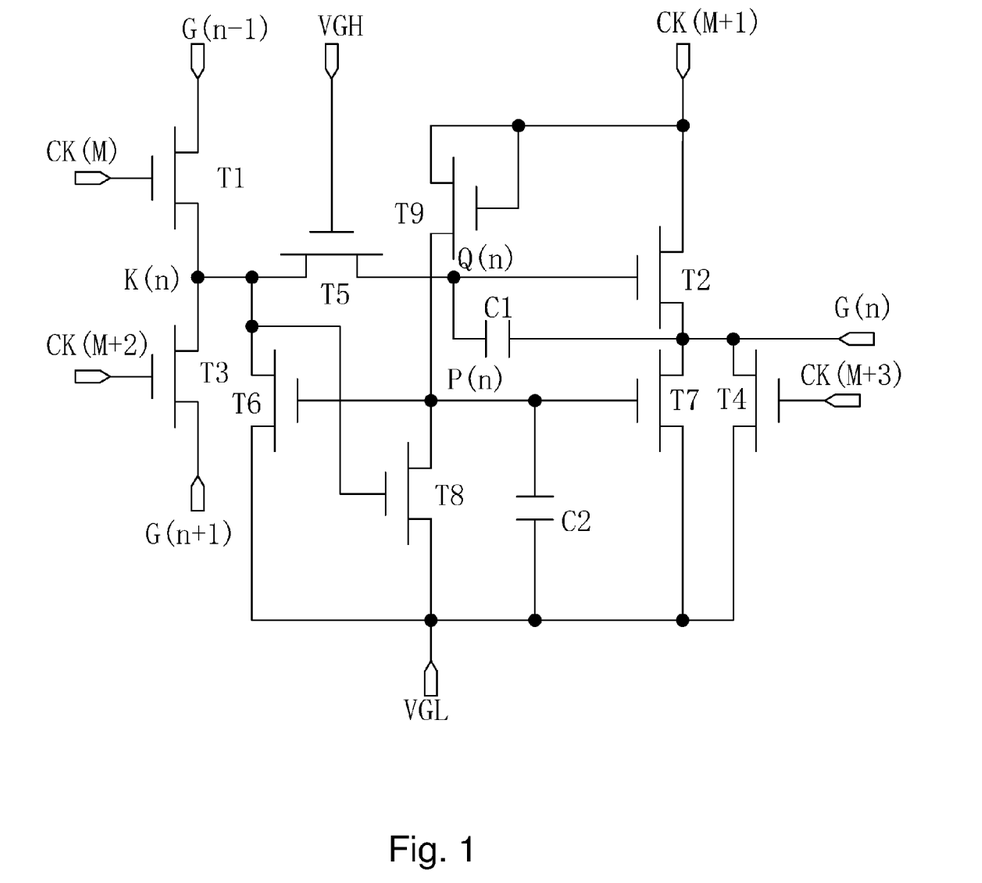
FIG. 1 is a circuit diagram of a GOA circuit based on LTPS semiconductor thin film transistor according to prior art.

Please refer to FIG. 1. A GOA circuit based on LTPS semiconductor thin film transistor according to prior art comprises GOA units of a plurality of stages, and n is set to be a positive integer, and the nth stage GOA unit comprises: a first thin film transistor T1, and a gate of the first thin film transistor T1 is electrically coupled to a Mth clock signal CK(M), and a source is electrically coupled to an output end G(n−1) of a former stage n−1th GOA unit, and a drain is electrically coupled to a third node K(n); a second thin film transistor T2, and a gate of the second thin film transistor T2 is electrically coupled to the first node Q(n), and a source is electrically coupled to a M+1th clock signal CK(M+1), and a drain is electrically coupled to an output end G(n); a third thin film transistor T3, and a gate of the third thin film transistor T3 is electrically coupled to a M+2th clock signal CK(M+2), and a drain is electrically coupled to the third node K(n), and a source is electrically coupled to an output end G(n+1) of a latter stage n+1th GOA unit; a fourth thin film transistor T4, and a gate of the fourth thin film transistor T4 is electrically coupled to a M+3th clock signal CK(M+3), and a drain is electrically coupled to the output end G(n), and a source is electrically coupled to a constant low voltage level VGL; a fifth thin film transistor T5, and a gate of the fifth thin film transistor T5 is electrically coupled to a constant high voltage level VGH, and a source is electrically coupled to the third node K(n), and a drain is electrically coupled to the first node Q(n); a sixth thin film transistor T6, a gate of the sixth thin film transistor T6 is electrically coupled to the second node P(n), and a drain is electrically coupled to the third node K(n), and a source is electrically coupled to the constant low voltage level VGL; a seventh thin film transistor T7, and a gate of the seventh thin film transistor T7 is electrically coupled to the second node P(n), and a drain is electrically coupled to the output end G(n), and a source is electrically coupled to the constant low voltage level VGL; an eighth thin film transistor T8, and a gate of the eighth thin film transistor T8 is electrically coupled to the third node K(n), and a drain is electrically coupled to the second node P(n), and a source is electrically coupled to the constant low voltage level VGL; a ninth thin film transistor T9, and both a gate and a source of the ninth thin film transistor T9 are electrically coupled to the M+1th clock signal CK(M+1), and a drain is electrically coupled to the second node P(n); a first capacitor C1, and one end of the first capacitor C1 is electrically coupled to the first node Q(n), and the other end is electrically coupled to the output end G(n); a second capacitor C2, and one end of the second capacitor C2 is electrically coupled to second node P(n), and the other end is electrically coupled to the constant low voltage level VGL.

Figure 2:
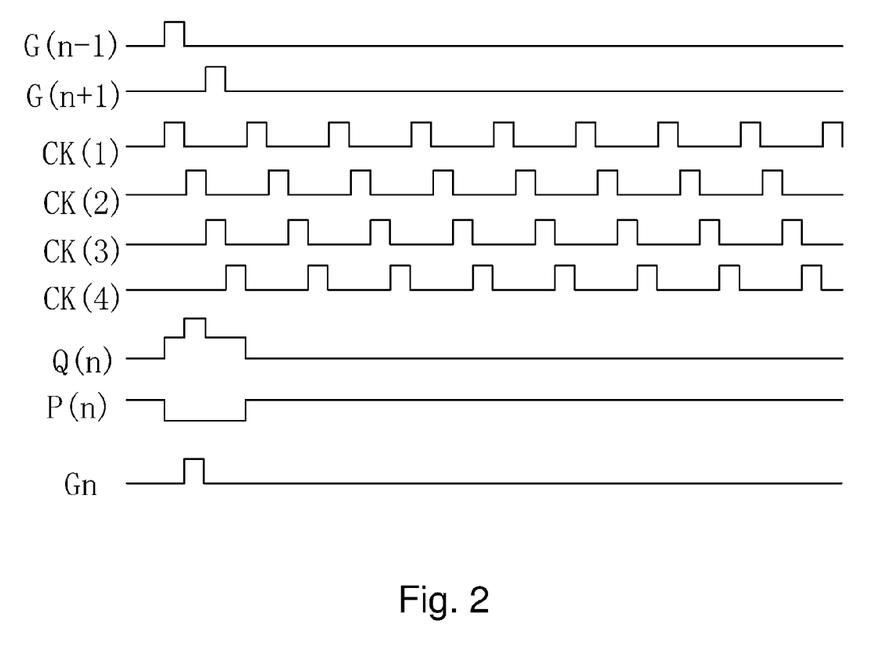
FIG. 2 is a sequence diagram of forward scan corresponding to the GOA circuit based on LTPS semiconductor thin film transistor shown in FIG. 1.

The GOA circuit shown in FIG. 1 can perform forward scan and backward scan. The working processes of the forward, backward scans are similar. With combination of FIG. 1 and FIG. 2, the forward scan is illustrated. As forward scanning, the working process is: first, Both the Mth clock signal CK(M) and the output end G(n−1) of the former stage n−1th GOA unit provides high voltage level, and the first and the fifth thin film transistors T1, T5 are on, and the first node Q(n) is pre-charged to high voltage level; then, the Mth clock signal CK(M) and the output end G(n−1) of the former stage n−1th GOA unit drop to be low voltage level, and the M+1th clock signal CK(M+1) provides high voltage level, and the first node Q(n) is held to be high voltage level due to the storage function of the first capacitor C1, and the second thin film transistor T2 is on, and the output end G(n) outputs the high voltage level of the M+1th clock signal CK(M+1) to raise the first node Q(n) to be higher voltage level, and meanwhile, the eighth thin film transistor T8 is on, and the second node P(n) is pulled down to be the constant low voltage level, and the sixth, seventh thin film transistors T6, T7 are off; then, both the M+2clock signal CK(M+2) and the output end G(n+1) of the latter stage n+1th GOA unit provide high voltage level, and the first node is still high voltage level, and the M+1th clock signal CK(M+1) drops to be low voltage level, and the output end G(n) outputs the low voltage of the M+1th clock signal CK(M+1); and then, the Mth clock signal provides high voltage level, again, and the output end G(n−1) of the former stage n−1th GOA unit is held to be low voltage level, and the first thin film transistor T1 is on to pull down the first node Q(n) to be low voltage level, and the eighth thin film transistor T8 is off; thereafter, the M+1th clock signal CK(M+1) provides high voltage level, and the ninth thin film transistor T9 is on, and the second node P(n) is charged to be the high voltage level of the M+1th clock signal CK(M+1), and the sixth, seventh thin film transistors T6, T7 are on to hole the low voltage levels of the first node Q(n) and the output end.

In the aforesaid GOA circuit based on LTPS semiconductor thin film transistor according to prior art, for the GOA unit of any stage, the voltage level of the second node P(n) and the output signal of the output end G(n) are both controlled with the M+1th clock signal CK(M+1), and the first node Q(n) is charged and discharged through the Mth clock signal CK(M) and the M+2th clock signal CK(M+2). Such arrangement will increase the serious delay of the output, and result in the function failure of the GOA circuit.

With the development and the population of the liquid crystal display, the market is asking the narrow frame design of the liquid crystal display panel as possible as it can be. For realizing the narrow frame design, it does not want to have too many thin film transistors as designing the GOA circuit, either.

SUMMARY OF THE INVENTION

An objective of the present invention is to provide a GOA circuit based on LTPS semiconductor thin film transistor, of which the clock signal is merely in charge of the output of the GOA unit of corresponding stage, which can effectively reduce the loading of the clock signal and it ensures that the entire loading of the clock signal after the GOA units of multiple stages are coupled. The present invention can give consideration to the narrow frame design as promoting the output stability of the GOA circuit.

For realizing the aforesaid objective, the present invention provides a GOA circuit based on LTPS semiconductor thin film transistor, comprising GOA units of a plurality of stages which are cascade coupled, and the GOA unit of each stage comprises: a scan control unit, an output unit and a node control unit;

n is set to be a positive integer and except the GOA units of the first, the second, the next to last and the last stages, in the nth stage GOA unit:

the scan control unit comprises: a first thin film transistor, and a gate of the first thin film transistor is electrically coupled to an output end of a two former stage n−2th GOA unit, and a source is electrically coupled to a forward scan direct current control signal, and a drain is electrically coupled to a third node; and a third thin film transistor, and a gate of the third thin film transistor is electrically coupled to an output end of a two latter stage n+2th GOA unit, and a source is electrically coupled to a backward scan direct current control signal, and a drain is electrically coupled to the third node;

the output unit comprises: a second thin film transistor, and a gate of the second thin film transistor is electrically coupled to the first node, and a source is electrically coupled to a Mth clock signal, and a drain is electrically coupled to an output end; and a bootstrap capacitor, and one end of the bootstrap capacitor is electrically coupled to a first node, and the other end is electrically coupled to the output end;

the node control unit comprises: a fourth thin film transistor, and a gate of the fourth thin film transistor is electrically coupled to a constant high voltage level, and a source is electrically coupled to the third node, and a drain is electrically coupled to the first node; a fifth thin film transistor, and a gate of the fifth thin film transistor is electrically coupled to a second node, and a drain is electrically coupled to the third node, and a source is electrically coupled to a constant low voltage level; a sixth thin film transistor, a gate of the sixth thin film transistor is electrically coupled to the second node, and a drain is electrically coupled to the output end, and a source is electrically coupled to the constant low voltage level; a seventh thin film transistor, and a gate of the seventh thin film transistor is electrically coupled to the constant high voltage level, and a source is electrically coupled to a fourth node, and a drain is electrically coupled to the second node; an eighth thin film transistor, and a gate of the eighth thin film transistor is electrically coupled to the third node, and a drain is electrically coupled to the fourth node, and a source is electrically coupled to the constant low voltage level; a ninth thin film transistor, and both a gate and a source of the ninth thin film transistor are electrically coupled to the forward scan direct current control signal, and a drain is electrically coupled to the fourth node; and a tenth thin film transistor, and both a gate and a source of the tenth thin film transistor are electrically coupled to the backward scan direct current control signal and a drain is electrically coupled to the fourth node;

The voltage levels of the forward scan direct current control signal and the backward scan direct current control signal are opposite.

The voltage level of the first node and the voltage level of the second node are both controlled by the forward scan direct current control signal and the backward scan direct current control signal.

In the first stage GOA unit and the second stage GOA unit, the gate of the first thin film transistor is electrically coupled to a start signal.

In the next to last stage GOA unit and the last stage GOA unit, the gate of the third thin film transistor is electrically coupled to a start signal.

As the forward scan direct current control signal is high voltage level and the backward scan direct current control signal is low voltage level, a forward scan is performed.

As the forward scan direct current control signal is low voltage level and the backward scan direct current control signal is high voltage level, a backward scan is performed.

The clock signal comprises four clock signals: a first clock signal, a second clock signal, a third clock signal and a fourth clock signal.

The thin film transistors are all N type LTPS thin film transistors.

The present invention further provides a GOA circuit based on LTPS semiconductor thin film transistor, comprising GOA units of a plurality of stages which are cascade coupled, and the GOA unit of each stage comprises: a scan control unit, an output unit and a node control unit;

n is set to be a positive integer and except the GOA units of the first, the second, the next to last and the last stages, in the nth stage GOA unit:

the scan control unit comprises: a first thin film transistor, and a gate of the first thin film transistor is electrically coupled to an output end of a two former stage n−2th GOA unit, and a source is electrically coupled to a forward scan direct current control signal, and a drain is electrically coupled to a third node; and a third thin film transistor, and a gate of the third thin film transistor is electrically coupled to an output end of a two latter stage n+2th GOA unit, and a source is electrically coupled to a backward scan direct current control signal, and a drain is electrically coupled to the third node;

the output unit comprises: a second thin film transistor, and a gate of the second thin film transistor is electrically coupled to the first node, and a source is electrically coupled to a Mth clock signal, and a drain is electrically coupled to an output end; and a bootstrap capacitor, and one end of the bootstrap capacitor is electrically coupled to a first node, and the other end is electrically coupled to the output end;

the node control unit comprises: a fourth thin film transistor, and a gate of the fourth thin film transistor is electrically coupled to a constant high voltage level, and a source is electrically coupled to the third node, and a drain is electrically coupled to the first node; a fifth thin film transistor, and a gate of the fifth thin film transistor is electrically coupled to a second node, and a drain is electrically coupled to the third node, and a source is electrically coupled to a constant low voltage level; a sixth thin film transistor, a gate of the sixth thin film transistor is electrically coupled to the second node, and a drain is electrically coupled to the output end, and a source is electrically coupled to the constant low voltage level; a seventh thin film transistor, and a gate of the seventh thin film transistor is electrically coupled to the constant high voltage level, and a source is electrically coupled to a fourth node, and a drain is electrically coupled to the second node; an eighth thin film transistor, and a gate of the eighth thin film transistor is electrically coupled to the third node, and a drain is electrically coupled to the fourth node, and a source is electrically coupled to the constant low voltage level; a ninth thin film transistor, and both a gate and a source of the ninth thin film transistor are electrically coupled to the forward scan direct current control signal, and a drain is electrically coupled to the fourth node; and a tenth thin film transistor, and both a gate and a source of the tenth thin film transistor are electrically coupled to the backward scan direct current control signal and a drain is electrically coupled to the fourth node;

voltage levels of the forward scan direct current control signal and the backward scan direct current control signal are opposite;

wherein the voltage level of the first node and the voltage level of the second node are both controlled by the forward scan direct current control signal and the backward scan direct current control signal;

wherein in the first stage GOA unit and the second stage GOA unit, the gate of the first thin film transistor is electrically coupled to a start signal;

wherein in the next to last stage GOA unit and the last stage GOA unit, the gate of the third thin film transistor is electrically coupled to a start signal.

The benefits of the present invention are: the present invention provides a GOA circuit based on LTPS semiconductor thin film transistor to control the voltage levels of the first node and the second node with the forward scan direct current control signal and the backward scan direct current control signal. The clock signal is merely in charge of the output of the GOA unit of corresponding stage, which can effectively reduce the loading of the clock signal. It ensures that the entire loading of the clock signal after the GOA units of multiple stages are coupled to promote the output stability of the GOA circuit, and to realize the forward-backward scan of the GOA circuit. Moreover, the GOA unit of each stage comprises only ten thin film transistors, which is beneficial to reduce the layout space of the GOA circuit and to achieve the narrow frame design of the display device.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 3:
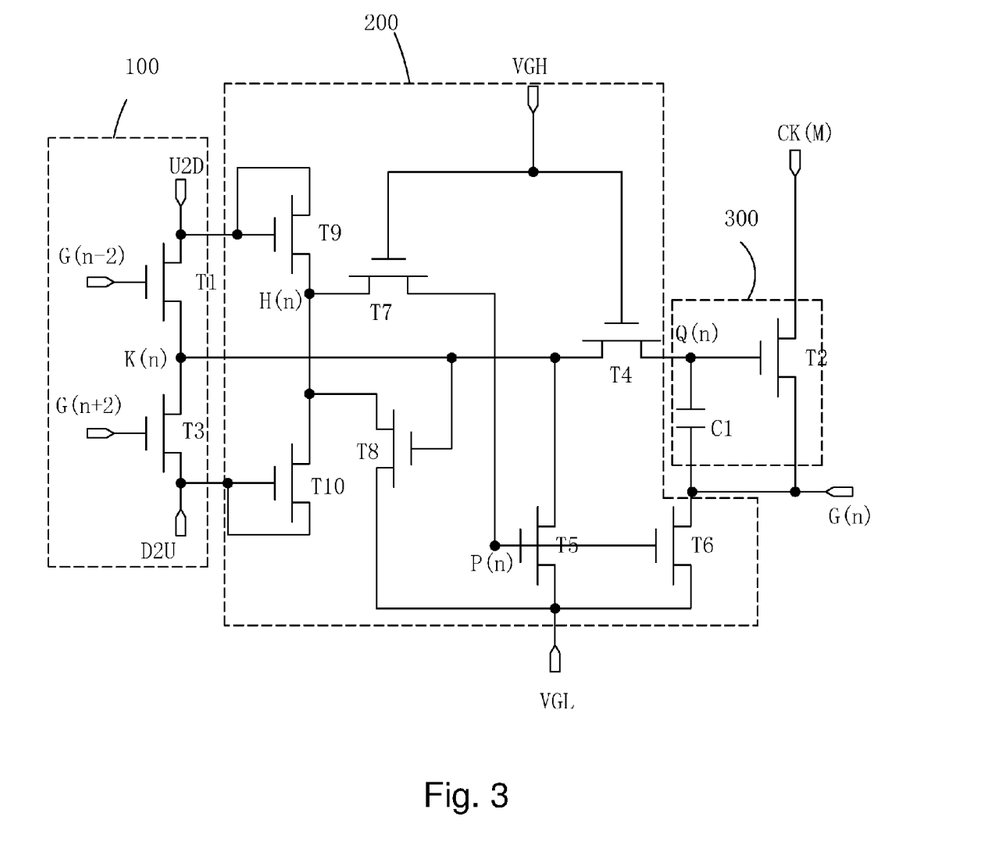
FIG. 3 is a circuit diagram of a GOA circuit based on LTPS semiconductor thin film transistor according to the present invention.

Please refer to FIG. 3. The present invention provides a GOA circuit based on LTPS semiconductor thin film transistor, comprising GOA units of a plurality of stages which are cascade coupled, and the GOA unit of each stage comprises: a scan control unit 100, an output unit 200 and a node control unit 300;

n is set to be a positive integer and except the GOA units of the first, the second, the next to last and the last stages, in the nth stage GOA unit:

the scan control unit 100 comprises: a first thin film transistor T1, and a gate of the first thin film transistor T1 is electrically coupled to an output end G(n−2) of a two former stage n−2th GOA unit, and a source is electrically coupled to a forward scan direct current control signal U2D, and a drain is electrically coupled to a third node K(n); and a third thin film transistor T3, and a gate of the third thin film transistor T3 is electrically coupled to an output end G(n+2) of a two latter stage n+2th GOA unit, and a source is electrically coupled to a backward scan direct current control signal D2U, and a drain is electrically coupled to the third node K(n);

the output unit 200 comprises: a second thin film transistor T2, and a gate of the second thin film transistor T2 is electrically coupled to the first node Q(n), and a source is electrically coupled to a Mth clock signal CK(M), and a drain is electrically coupled to an output end G(n); and a bootstrap capacitor C1, and one end of the bootstrap capacitor C1 is electrically coupled to a first node Q(n), and the other end is electrically coupled to the output end G(n);

the node control unit 300 comprises: a fourth thin film transistor T4, and a gate of the fourth thin film transistor T4 is electrically coupled to a constant high voltage level VGH, and a source is electrically coupled to the third node K(n), and a drain is electrically coupled to the first node Q(n); a fifth thin film transistor T5, and a gate of the fifth thin film transistor T5 is electrically coupled to a second node P(n), and a drain is electrically coupled to the third node K(n), and a source is electrically coupled to a constant low voltage level VGL; a sixth thin film transistor T6, a gate of the sixth thin film transistor T6 is electrically coupled to the second node P(n), and a drain is electrically coupled to the output end G(n), and a source is electrically coupled to the constant low voltage level VGL; a seventh thin film transistor T7, and a gate of the seventh thin film transistor T7 is electrically coupled to the constant high voltage level VGH, and a source is electrically coupled to a fourth node H(n), and a drain is electrically coupled to the second node P(n); an eighth thin film transistor T8, and a gate of the eighth thin film transistor T8 is electrically coupled to the third node K(n), and a drain is electrically coupled to the fourth node H(n), and a source is electrically coupled to the constant low voltage level VGL; a ninth thin film transistor T9, and both a gate and a source of the ninth thin film transistor T9 are electrically coupled to the forward scan direct current control signal U2D, and a drain is electrically coupled to the fourth node H(n); and a tenth thin film transistor T10, and both a gate and a source of the tenth thin film transistor T10 are electrically coupled to the backward scan direct current control signal D2U and a drain is electrically coupled to the fourth node H(n).

Specifically, the thin film transistors are all N type LTPS thin film transistors.

Figure 6:
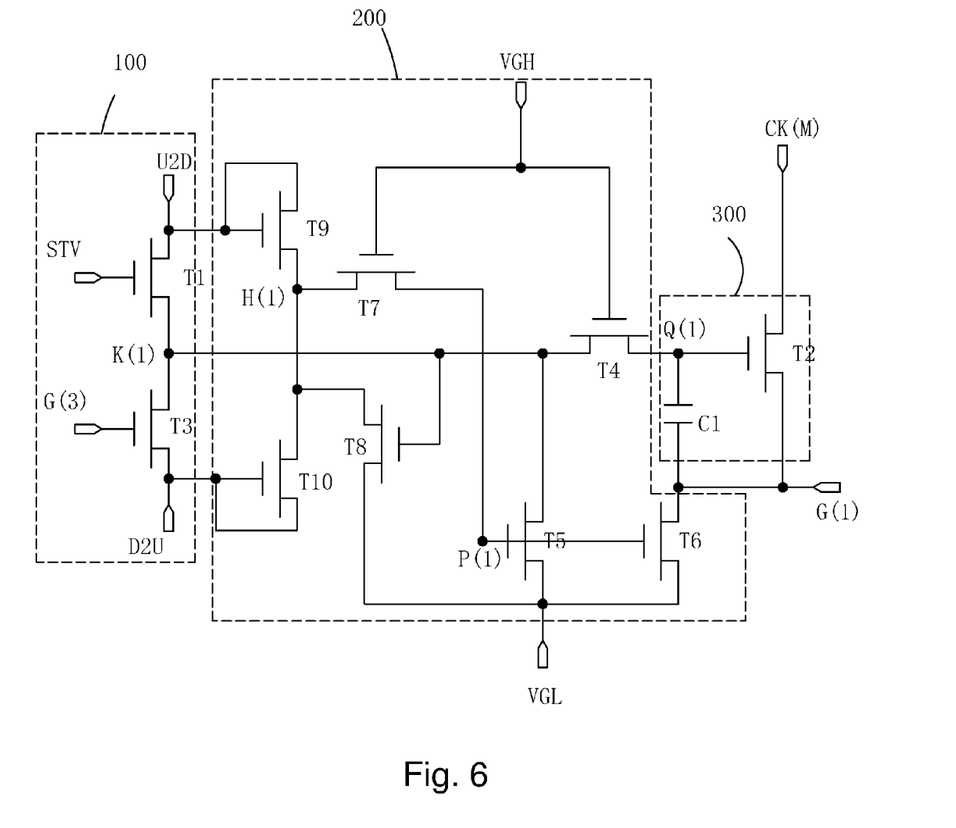
FIG. 6 is a circuit diagram of a first stage GOA unit of a GOA circuit based on LTPS semiconductor thin film transistor according to the present invention.
Figure 7:
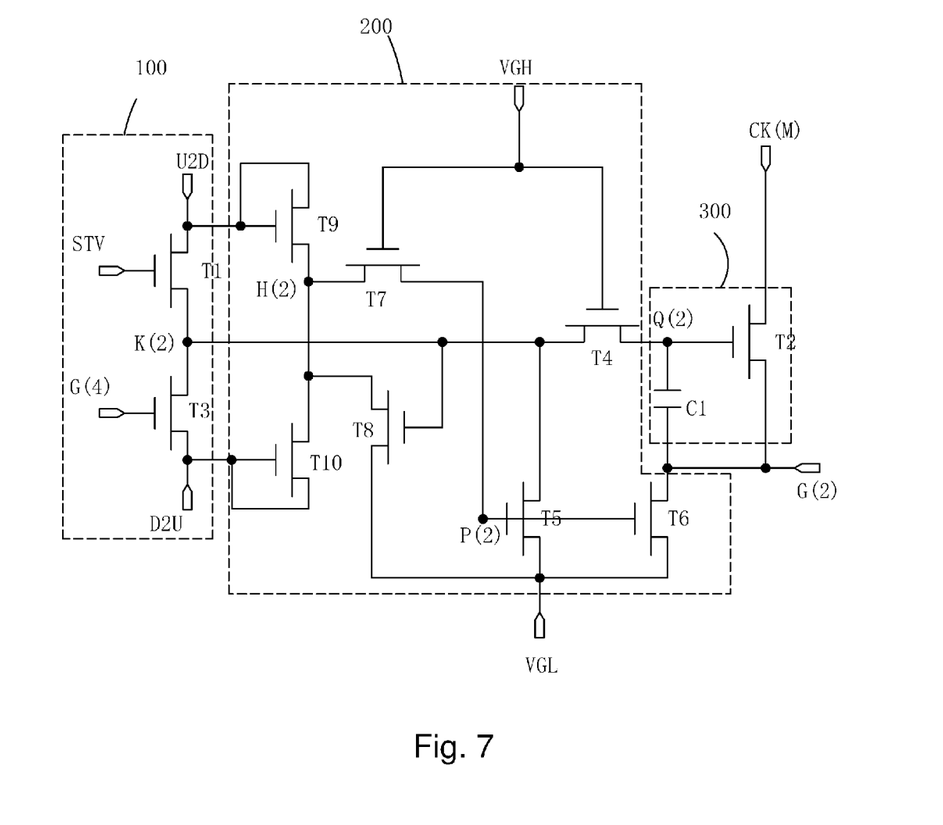
FIG. 7 is a circuit diagram of a second stage GOA unit of a GOA circuit based on LTPS semiconductor thin film transistor according to the present invention.
Figure 8:
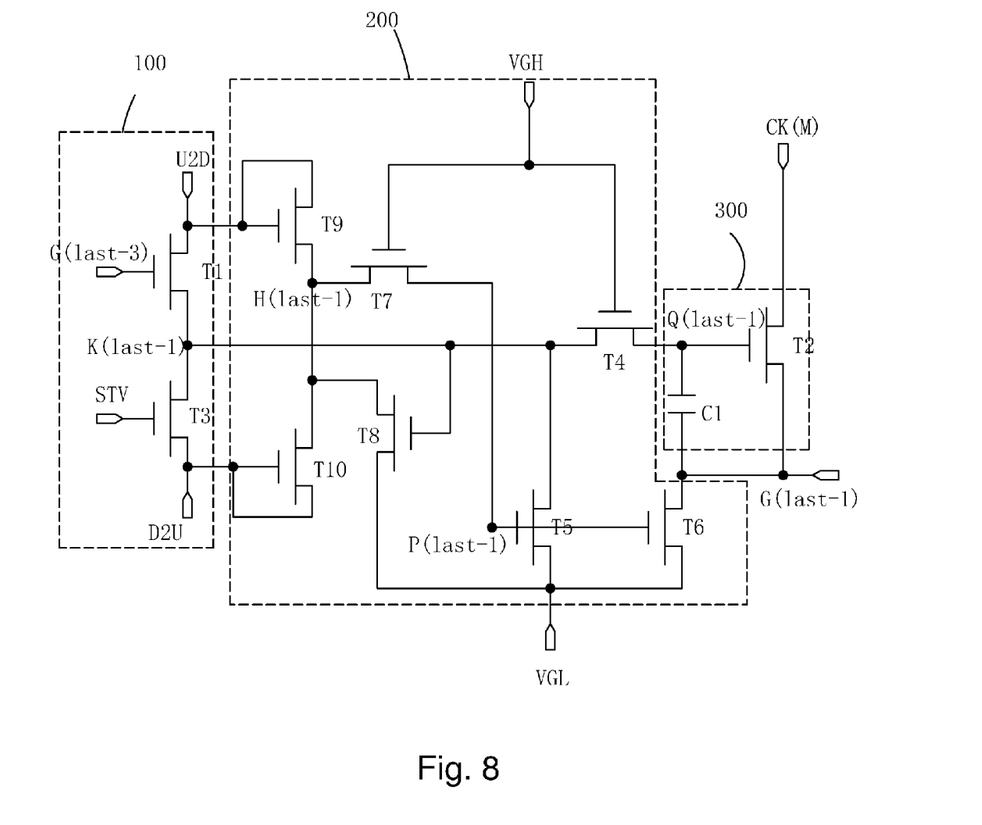
FIG. 8 is a circuit diagram of a next to last stage GOA unit of a GOA circuit based on LTPS semiconductor thin film transistor according to the present invention.
Figure 9:
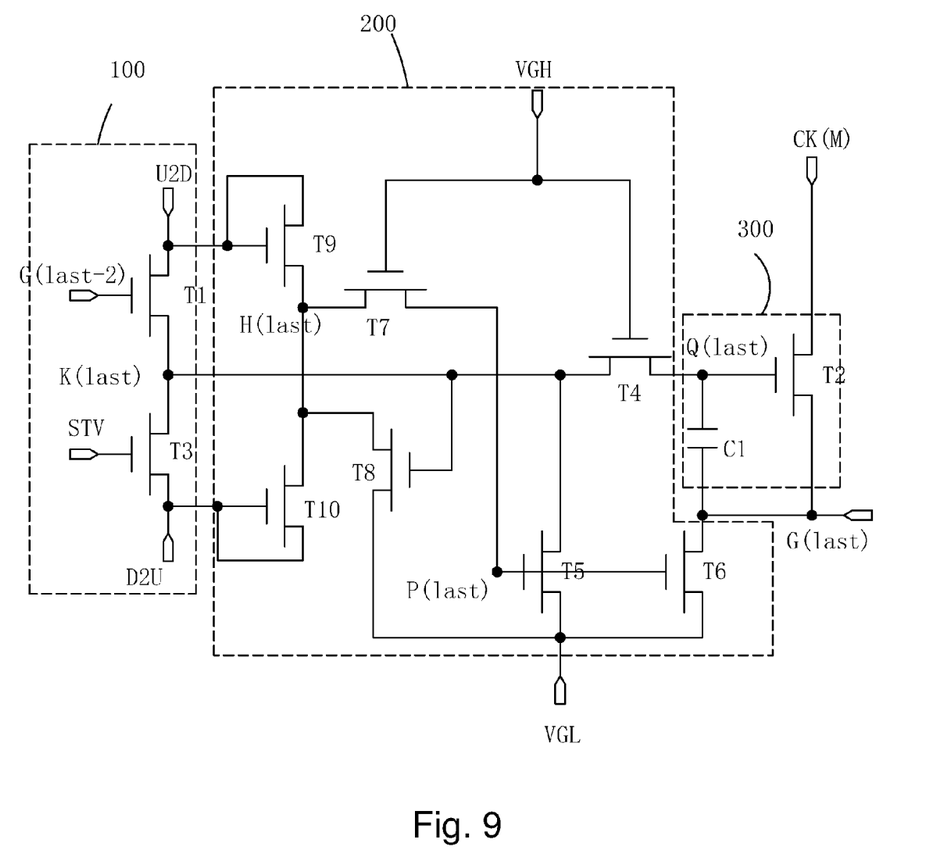
FIG. 9 is a circuit diagram of a last stage GOA unit of a GOA circuit based on LTPS semiconductor thin film transistor according to the present invention.

Particularly, please refer to FIG. 6 and FIG. 7, in the first stage GOA unit and the second stage GOA unit, the gate of the first thin film transistor is electrically coupled to a start signal; please refer to FIG. 8 and FIG. 9, in the next to last stage GOA unit and the last stage GOA unit, the gate of the third thin film transistor is electrically coupled to a start signal.

The GOA circuit based on LTPS semiconductor thin film transistor according to the present invention possesses the forward-backward scan function. The voltage levels of the forward scan direct current control signal U2D and the backward scan direct current control signal D2U are opposite. As the forward scan direct current control signal U2D is high voltage level and the backward scan direct current control signal D2U is low voltage level, the GOA circuit performs a forward scan. As the forward scan direct current control signal U2D is low voltage level and the backward scan direct current control signal D2U is high voltage level, the GOA circuit performs a backward scan.

Figure 4:
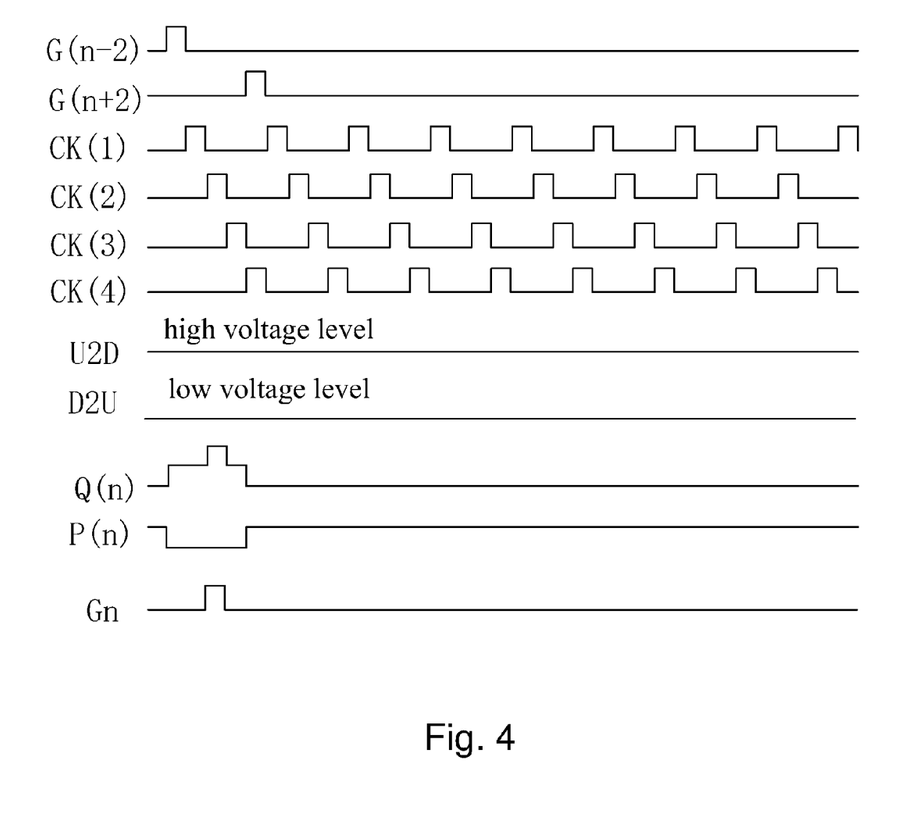
FIG. 4 is a sequence diagram of a GOA circuit based on LTPS semiconductor thin film transistor as performing a forward scan.
Figure 5:
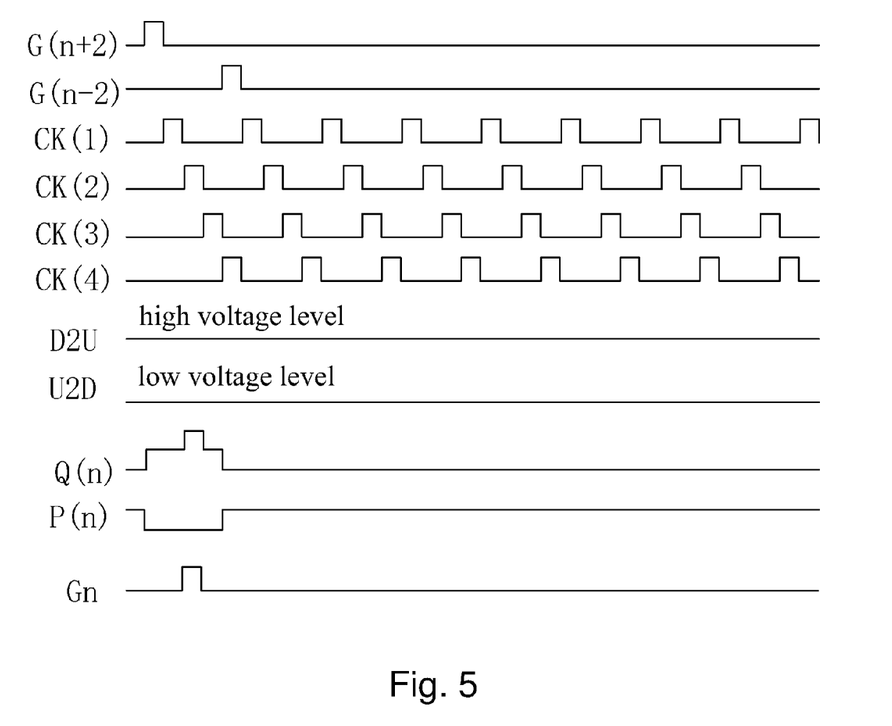
FIG. 5 is a sequence diagram of a GOA circuit based on LTPS semiconductor thin film transistor as performing a backward scan.

Please refer to FIG. 4 or FIG. 5. The GOA circuit based on LTPS semiconductor thin film transistor comprises four clock signals: a first clock signal CK(1), a second clock signal CK(2), a third clock signal CK(3) and a fourth clock signal CK(4). Each clock signal corresponds to the GOA unit of one stage. For example: the first clock signal CK(1) is inputted to the first stage GOA unit, and the second clock signal CK(2) is inputted to the second stage GOA unit, and the third clock signal CK(3) is inputted to the third stage GOA unit, and the fourth clock signal CK(4) is inputted to the fourth stage GOA unit, and so on. The clock signal is merely employed to be outputted for the output end of the corresponding GOA unit.

Significantly, Either the GOA circuit based on LTPS semiconductor thin film transistor performs the forward scan or the backward scan, the clock signal CK(M) is merely in charge of the outputting of the output end G(n) of the corresponding GOA unit, and the voltage levels of the key nodes, the first node Q(n) and the second node P(n) are both controlled by the forward scan direct current control signal U2D and the backward scan direct current control signal D2U, which can effectively reduce the loading of the clock signal. It ensures that the entire loading of the clock signal after the GOA units of multiple stages are coupled to promote the output stability of the GOA circuit.

With combination of FIG. 3 and FIG. 4, the forward scan direct current control signal U2D is high voltage level and the backward scan direct current control signal D2U is low voltage level, and the GOA unit performs the forward scan, and the specific working process is:

Stage 1, pre-charge stage: the output end G(n−2) of the two former stage n−2th GOA unit and the forward scan direct current control signal U2D are both high voltage levels, and the first thin film transistor T1 is on, and the fourth thin film transistor T4 is controlled by the constant high voltage level VGH to be in on state all the time, and the first node Q(n) is pre-charged to the high voltage level by the forward scan direct current control signal U2D of high voltage level.

Stage 2, high voltage level output stage: the output end G(n−2) of the two former stage n−2th GOA unit drops to be low voltage level, and the Mth clock signal CK(M) provides the high voltage level, and the first thin film transistor T1 is off, and the first node Q(n) is kept to be high voltage level under the function of the boost capacitor C1, and the second thin film transistor T2 is on, and the high voltage level provided by the Mth clock signal CK(M) is outputted through the output end G(n), and raises the first node Q(n) to be the higher voltage level; the eighth thin film transistor T8 controlled by the first node Q(n) is on to pull down the voltage level of the fourth node H(n) to the constant low voltage level VGL, and the seventh thin film transistor T7 is controlled by the constant high voltage level VGH to be in on state all the time to pull down the second node P(n) to the constant low voltage level VGL, and the fifth and sixth thin film transistors T5, T6 are off.

Stage 3, low voltage level output stage: the Mth clock signal CK(M) provides low voltage level, and the first node Q(n) is kept to be high voltage level, and the second thin film transistor T2 remains to be on, and the low voltage level provided by the Mth clock signal CK(M) is outputted through the output end G(n).

Stage 4, first node pull down stage: the output end G(n−2) of the two former stage n−2th GOA unit, and the backward scan direct current control signal D2U is the low voltage level, and the third thin film transistor T3 is on, and the fourth thin film transistor T4 is on, and the voltage levels of the third node K(n) and the first node Q(n) is pulled down to the low voltage level by the backward scan direct current control signal D2U of the low voltage level.

Stage 5, first node and output end pull down holding stage: after the third node K(n) and the first node Q(n) become low voltage levels, the eighth thin film transistor T8 is off, and because the forward scan direct current control signal U2D is high voltage level and the backward scan direct current control signal D2U is low voltage level, the ninth thin film transistor T9 is on and the tenth thin film transistor T10 is off, and the fourth node H(n) is charged to the high voltage level by the forward scan direct current control signal U2D of the high voltage level, and the seventh thin film transistor T7 is on all the time, and the second node P(n) is charged to the high voltage level by forward scan direct current control signal U2D of the high voltage level, and the fifth and sixth thin film transistors T5, T6 are on, and the first node Q(n) and the output end G(n) are pulled down and held at the constant low voltage level VGL.

With combination of FIG. 3 and FIG. 5, the forward scan direct current control signal U2D is low voltage level and the backward scan direct current control signal D2U is high voltage level, and the GOA unit performs the backward scan, and the specific working process is:

Stage 1, pre-charge stage: the output end G(n+2) of the two latter stage n−2th GOA unit and the backward scan direct current control signal D2U are both high voltage levels, and the third thin film transistor T3 is on, and the fourth thin film transistor T4 is controlled by the constant high voltage level VGH to be in on state all the time, and the first node Q(n) is pre-charged to the high voltage level by the backward scan direct current control signal D2U of high voltage level.

Stage 2, high voltage level output stage: the output end G(n+2) of the two latter stage n+2th GOA unit drops to be low voltage level, and the Mth clock signal CK(M) provides the high voltage level, and the third thin film transistor T3 is off, and the first node Q(n) is held to be high voltage level under the function of the boost capacitor C1, and the second thin film transistor T2 is on, and the high voltage level provided by the Mth clock signal CK(M) is outputted through the output end G(n), and raises the first node Q(n) to be the higher voltage level; the eighth thin film transistor T8 controlled by the first node Q(n) is on to pull down the voltage level of the fourth node H(n) to the constant low voltage level VGL, and the seventh thin film transistor T7 is controlled by the constant high voltage level VGH to be in on state all the time to pull down the second node P(n) to the constant low voltage level VGL, and the fifth and sixth thin film transistors T5, T6 are off.

Stage 3, low voltage level output stage: the Mth clock signal CK(M) provides low voltage level, and the first node Q(n) is kept to be high voltage level, and the second thin film transistor T2 remains to be on, and the low voltage level provided by the Mth clock signal CK(M) is outputted through the output end G(n).

Stage 4, first node pull down stage: the output end G(n−2) of the two former stage n−2th GOA unit, and the forward scan direct current control signal U2D is the low voltage level, and the first thin film transistor T1 is on, and the fourth thin film transistor T4 is on, and the voltage levels of the third node K(n) and the first node Q(n) is pulled down to the low voltage level by the forward scan direct current control signal U2D of the low voltage level.

Stage 5, first node and output end pull down holding stage: after the third node K(n) and the first node Q(n) become low voltage levels, the eighth thin film transistor T8 is off, and because the forward scan direct current control signal U2D is low voltage level and the backward scan direct current control signal D2U is high voltage level, the ninth thin film transistor T9 is off and the tenth thin film transistor T10 is on, and the fourth node H(n) is charged to the high voltage level by the backward scan direct current control signal D2U of the high voltage level, and the seventh thin film transistor T7 is on all the time, and the second node P(n) is charged to the high voltage level by backward scan direct current control signal D2U of the high voltage level, and the fifth and sixth thin film transistors T5, T6 are on, and both the first node Q(n) and the output end G(n) are pulled down and held at the constant low voltage level VGL.

Significantly, the GOA circuit based on LTPS semiconductor thin film transistor of the present invention can realize the forward-backward scan and effectively reduce the loading of the clock signal. The GOA unit of each stage comprises only ten thin film transistors, which is beneficial to reduce the layout space of the GOA circuit and to achieve the narrow frame design of the display device.

In conclusion, the GOA circuit based on LTPS semiconductor thin film transistor of the present invention controls the voltage levels of the first node and the second node with the forward scan direct current control signal and the backward scan direct current control signal. The clock signal is merely in charge of the output of the GOA unit of corresponding stage, which can effectively reduce the loading of the clock signal. It ensures that the entire loading of the clock signal after the GOA units of multiple stages are coupled to promote the output stability of the GOA circuit, and to realize the forward-backward scan of the GOA circuit. Moreover, the GOA unit of each stage comprises only ten thin film transistors, which is beneficial to reduce the layout space of the GOA circuit and to achieve the narrow frame design of the display device.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit based on LTPS semiconductor thin film transistor, comprising GOA units of a plurality of stages which are cascade coupled, and the GOA unit of each stage comprises: a scan control unit, an output unit and a node control unit;

wherein n is set to be a positive integer and except the GOA units of the first, the second, the next to last and the last stages, in the nth stage GOA unit:

the scan control unit comprises: a first thin film transistor, and a gate of the first thin film transistor is electrically coupled to an output end of a two former stage n−2th GOA unit, and a source is electrically coupled to a forward scan direct current control signal, and a drain is electrically coupled to a third node; and a third thin film transistor, and a gate of the third thin film transistor is electrically coupled to an output end of a two latter stage n+2th GOA unit, and a source is electrically coupled to a backward scan direct current control signal, and a drain is electrically coupled to the third node;

the output unit comprises: a second thin film transistor, and a gate of the second thin film transistor is electrically coupled to a first node, and a source is electrically coupled to a Mth clock signal, and a drain is electrically coupled to an output end; and a bootstrap capacitor, and one end of the bootstrap capacitor is electrically coupled to the first node, and the other end is electrically coupled to the output end;

the node control unit comprises: a fourth thin film transistor, and a gate of the fourth thin film transistor is electrically coupled to a constant high voltage level, and a source is electrically coupled to the third node, and a drain is electrically coupled to the first node; a fifth thin film transistor, and a gate of the fifth thin film transistor is electrically coupled to a second node, and a drain is electrically coupled to the third node, and a source is electrically coupled to a constant low voltage level; a sixth thin film transistor, a gate of the sixth thin film transistor is electrically coupled to the second node, and a drain is electrically coupled to the output end, and a source is electrically coupled to the constant low voltage level; a seventh thin film transistor, and a gate of the seventh thin film transistor is electrically coupled to the constant high voltage level, and a source is electrically coupled to a fourth node, and a drain is electrically coupled to the second node; an eighth thin film transistor, and a gate of the eighth thin film transistor is electrically coupled to the third node, and a drain is electrically coupled to the fourth node, and a source is electrically coupled to the constant low voltage level; a ninth thin film transistor, and both a gate and a source of the ninth thin film transistor are electrically coupled to the forward scan direct current control signal, and a drain is electrically coupled to the fourth node; and a tenth thin film transistor, and both a gate and a source of the tenth thin film transistor are electrically coupled to the backward scan direct current control signal and a drain is electrically coupled to the fourth node;

voltage levels of the forward scan direct current control signal and the backward scan direct current control signal are opposite.

2. The GOA circuit based on LTPS semiconductor thin film transistor according to claim 1, wherein a voltage level of the first node and a voltage level of the second node are both controlled by the forward scan direct current control signal and the backward scan direct current control signal.

3. The GOA circuit based on LTPS semiconductor thin film transistor according to claim 1, wherein in the first stage GOA unit and the second stage GOA unit, the gate of the first thin film transistor is electrically coupled to a start signal.

4. The GOA circuit based on LTPS semiconductor thin film transistor according to claim 1, wherein in the next to last stage GOA unit and the last stage GOA unit, the gate of the third thin film transistor is electrically coupled to a start signal.

5. The GOA circuit based on LTPS semiconductor thin film transistor according to claim 1, wherein as the forward scan direct current control signal is high voltage level and the backward scan direct current control signal is low voltage level, a forward scan is performed.

6. The GOA circuit based on LTPS semiconductor thin film transistor according to claim 1, wherein as the forward scan direct current control signal is low voltage level and the backward scan direct current control signal is high voltage level, a backward scan is performed.

7. The GOA circuit based on LTPS semiconductor thin film transistor according to claim 1, wherein the clock signal comprises four clock signals: a first clock signal, a second clock signal, a third clock signal and a fourth clock signal.

8. The GOA circuit based on LTPS semiconductor thin film transistor according to claim 1, wherein the thin film transistors are all N type LTPS thin film transistors.

9. A GOA circuit based on LTPS semiconductor thin film transistor, comprising GOA units of a plurality of stages which are cascade coupled, and the GOA unit of each stage comprises: a scan control unit, an output unit and a node control unit;

wherein n is set to be a positive integer and except the GOA units of the first, the second, the next to last and the last stages, in the nth stage GOA unit:

the scan control unit comprises: a first thin film transistor, and a gate of the first thin film transistor is electrically coupled to an output end of a two former stage n−2th GOA unit, and a source is electrically coupled to a forward scan direct current control signal, and a drain is electrically coupled to a third node; and a third thin film transistor, and a gate of the third thin film transistor is electrically coupled to an output end of a two latter stage n+2th GOA unit, and a source is electrically coupled to a backward scan direct current control signal, and a drain is electrically coupled to the third node;

the output unit comprises: a second thin film transistor, and a gate of the second thin film transistor is electrically coupled to a first node, and a source is electrically coupled to a Mth clock signal, and a drain is electrically coupled to an output end; and a bootstrap capacitor, and one end of the bootstrap capacitor is electrically coupled to the first node, and the other end is electrically coupled to the output end;

the node control unit comprises: a fourth thin film transistor, and a gate of the fourth thin film transistor is electrically coupled to a constant high voltage level, and a source is electrically coupled to the third node, and a drain is electrically coupled to the first node; a fifth thin film transistor, and a gate of the fifth thin film transistor is electrically coupled to a second node, and a drain is electrically coupled to the third node, and a source is electrically coupled to a constant low voltage level; a sixth thin film transistor, a gate of the sixth thin film transistor is electrically coupled to the second node, and a drain is electrically coupled to the output end, and a source is electrically coupled to the constant low voltage level; a seventh thin film transistor, and a gate of the seventh thin film transistor is electrically coupled to the constant high voltage level, and a source is electrically coupled to a fourth node, and a drain is electrically coupled to the second node; an eighth thin film transistor, and a gate of the eighth thin film transistor is electrically coupled to the third node, and a drain is electrically coupled to the fourth node, and a source is electrically coupled to the constant low voltage level; a ninth thin film transistor, and both a gate and a source of the ninth thin film transistor are electrically coupled to the forward scan direct current control signal, and a drain is electrically coupled to the fourth node; and a tenth thin film transistor, and both a gate and a source of the tenth thin film transistor are electrically coupled to the backward scan direct current control signal and a drain is electrically coupled to the fourth node;

voltage levels of the forward scan direct current control signal and the backward scan direct current control signal are opposite;

wherein a voltage level of the first node and a voltage level of the second node are both controlled by the forward scan direct current control signal and the backward scan direct current control signal;

wherein in the first stage GOA unit and the second stage GOA unit, the gate of the first thin film transistor is electrically coupled to a start signal;

wherein in the next to last stage GOA unit and the last stage GOA unit, the gate of the third thin film transistor is electrically coupled to a start signal.

10. The GOA circuit based on LTPS semiconductor thin film transistor according to claim 9, wherein as the forward scan direct current control signal is high voltage level and the backward scan direct current control signal is low voltage level, a forward scan is performed.

11. The GOA circuit based on LTPS semiconductor thin film transistor according to claim 9, wherein as the forward scan direct current control signal is low voltage level and the backward scan direct current control signal is high voltage level, a backward scan is performed.

12. The GOA circuit based on LTPS semiconductor thin film transistor according to claim 9, wherein the clock signal comprises four clock signals: a first clock signal, a second clock signal, a third clock signal and a fourth clock signal.

13. The GOA circuit based on LTPS semiconductor thin film transistor according to claim 9, wherein the thin film transistors are all N type LTPS thin film transistors.

* * * * *